(12) United States Patent
Cong et al.

(10) Patent No.: US 11,747,675 B2
(45) Date of Patent: Sep. 5, 2023

(54) DISPLAY APPARATUS

(71) Applicant: Hisense Visual Technology Co., Ltd., Shandong (CN)

(72) Inventors: Xiaodong Cong, Shandong (CN); Jibing Zhang, Shandong (CN); Gaobin Yan, Shandong (CN); Zhirui Zhang, Shandong (CN); Shang Gao, Shandong (CN)

(73) Assignee: HISENSE VISUAL TECHNOLOGY CO., LTD., Qingdao (CN)

( * ) Notice: Subject to any disclaimer, the term of this patent is extended or adjusted under 35 U.S.C. 154(b) by 0 days.

(21) Appl. No.: 17/580,431

(22) Filed: Jan. 20, 2022

(65) Prior Publication Data

US 2022/0146881 A1 May 12, 2022

Related U.S. Application Data

(63) Continuation of application No. PCT/CN2020/083859, filed on Apr. 9, 2020.

(30) Foreign Application Priority Data

Dec. 13, 2019 (CN) .......................... 201911285212.8
Dec. 13, 2019 (CN) .......................... 201922240134.1

(51) Int. Cl.
*G02F 1/13357* (2006.01)
*G02F 1/1335* (2006.01)
(Continued)

(52) U.S. Cl.
CPC .. *G02F 1/133606* (2013.01); *G02F 1/133603* (2013.01); *G02F 1/133605* (2013.01);
(Continued)

(58) Field of Classification Search
CPC ......... G02F 1/133607; G02F 1/133609; G02F 1/133611
See application file for complete search history.

(56) References Cited

U.S. PATENT DOCUMENTS

| 11,487,158 B2* | 11/2022 | Kim .................. G02F 1/133605 |
| 2006/0262555 A1* | 11/2006 | Yi ..................... G02F 1/133606 |
| | | 362/23.19 |

(Continued)

FOREIGN PATENT DOCUMENTS

| CN | 102759050 A | 10/2012 |
| CN | 104483778 A | 4/2015 |

(Continued)

OTHER PUBLICATIONS

International Search Report, dated Sep. 3, 2020, for PCT/CN2020/083859 filed Apr. 9, 2020.

*Primary Examiner* — Andrew J Coughlin
(74) *Attorney, Agent, or Firm* — Workman Nydegger (57) ABSTRACT

A display apparatus, including: a backlight module and a panel. The backlight module includes: a circuit board, a light-emitting device, and a quantum dot film layer; a fluorescent layer is provided in an orthographic projection area of the light-emitting device on the circuit board, and the fluorescent layer can absorb incident light and excite white light. When light emitted from the light-emitting device is incident onto the orthographic projection area, the fluorescent layer may first excite white light using a portion of the light, so that the intensity of light reflected to the quantum dot film layer is relatively weakened to just meet requirements of a quantum dot material on saturation of excited light, and the excited light of the quantum dot material and unexcited blue light may be mixed into white light which provides white backlight for the panel together with the white light excited by the fluorescent layer.

9 Claims, 6 Drawing Sheets

(51) Int. Cl.
  *H01L 25/075* (2006.01)
  *H01L 33/58* (2010.01)
  *H01L 33/60* (2010.01)
  *H01L 33/62* (2010.01)

(52) U.S. Cl.
  CPC .... *G02F 1/133614* (2021.01); *H01L 25/0753* (2013.01); *H01L 33/58* (2013.01); *H01L 33/60* (2013.01); *H01L 33/62* (2013.01)

(56) References Cited

U.S. PATENT DOCUMENTS

| | | | | |
|---|---|---|---|---|
| 2009/0027893 | A1* | 1/2009 | Chang | G02B 6/0043 362/333 |
| 2009/0091689 | A1 | 4/2009 | Rho et al. | |
| 2011/0013116 | A1* | 1/2011 | Matsuki | H01L 33/58 362/235 |
| 2015/0228869 | A1* | 8/2015 | Yoo | G02F 1/133609 362/97.3 |
| 2016/0161089 | A1* | 6/2016 | Jeon | G02F 1/133606 349/64 |
| 2018/0356685 | A1* | 12/2018 | Jang | G02F 1/133603 |
| 2020/0166680 | A1* | 5/2020 | Meng | G02F 1/133603 |
| 2021/0135066 | A1* | 5/2021 | Watanabe | H01L 33/0095 |
| 2021/0271135 | A1* | 9/2021 | Iwamoto | G02F 1/133603 |

FOREIGN PATENT DOCUMENTS

| | | |
|---|---|---|
| CN | 105202483 A | 12/2015 |
| CN | 105205483 A | 12/2015 |
| CN | 107167964 A | 9/2017 |
| CN | 108051952 A | 5/2018 |
| KR | 20120078883 A | 7/2012 |

* cited by examiner

FIG. 14

DISPLAY APPARATUS

CROSS-REFERENCE OF RELATED APPLICATIONS

The present disclosure is a continuation application of International Application No. PCT/CN2020/083859 filed Apr. 9, 2020, which claims the priorities from Chinese Patent Application No. 201911285212.8 filed on Dec. 13, 2019 and entitled "Display Apparatus" and Chinese Patent Application No. 201922240134.1 filed on Dec. 13, 2019 and entitled "Display Apparatus", which are hereby incorporated by reference in their entirety.

TECHNICAL FIELD

The present disclosure relates to display technologies and particularly to a display apparatus.

BACKGROUND

The liquid crystal display (LCD) screen, as the current mainstream display screen, has the advantages such as low power consumption, small volume, low radiation and so on. However, the LCD panel is not a self-lit panel and needs to work with a backlight module for use.

The Light Emitting Diode (LED), as the backlight source, has many advantages such as: high brightness, no decrease in brightness within a long life time, and the body of the LED backlight is thinner, which can achieve the lighter and thinner product.

With the proposal of the low-cost Quantum Dot (QD) lighting solution, the backlight module can facilitate the display with high color gamut and high image quality by combining the blue LED and the QD film. In order to lower the production cost, the number of LEDs and the films may be reduced. However, this causes the increasing space between the LEDs, and results in the emission of blue light from backlight module at the LED positions.

SUMMARY

The present disclosure provides a display apparatus in view of the blue light emission issue of the backlight module.

The present disclosure provides a display apparatus, including: a backlight module configured to provide backlight; a panel disposed on a light emitting side of the backlight module and configured for image display; the backlight module includes: a circuit board having bearing and support functions and configured to provide power; a light emitting device arranged on the circuit board; and a quantum dot film layer disposed on a side of the light emitting device facing away from the circuit board; where a fluorescent layer is provided in an orthographic projection area of the light emitting device on the circuit board, and the fluorescent layer is configured to absorb light emitted from the light emitting device to excite white light.

In some embodiments, the light emitting device includes: a light emitting diode disposed on the circuit board; a lens at a light emitting side of the light emitting diode; where the fluorescent layer is provided in an orthographic projection area of the lens on the circuit board.

In some embodiments, the fluorescent layer includes a spot-shaped fluorescent portions; the spot-shaped fluorescent portion are distributed in at least one ring around the light emitting diode; and a contour of the ring is similar to an outer contour of the orthographic projection of the lens on the circuit board.

In some embodiments, the spot-shaped fluorescent portion is circular or square.

In some embodiments, the fluorescent layer includes a strip-shaped fluorescent portions; the strip-shaped fluorescent portion are distributed around the light emitting diode; and the extending direction of the strip-shaped fluorescent portions is directed from the light emitting diode to an outer edge of the lens.

In some embodiments, the fluorescent layer includes two strip-shaped fluorescent portions parallel to each other; the strip-shaped fluorescent portions are located at both sides of the light emitting diode and at areas corresponding to edges of the lens, and both ends of the strip-shaped fluorescent portion extend to edges of the circuit board.

In some embodiments, the fluorescent layer includes a ring-shaped fluorescent portion; the ring-shaped fluorescent portion is around the light emitting diode; and a contour of the ring-shaped fluorescent portion is similar to an outer contour of the orthographic projection of the lens on the circuit board.

In some embodiments, the minimum width of the fluorescent portion is greater than or equal to 0.3 mm; spacing between two adjacent fluorescent portions is greater than or equal to 0.5 mm.

In some embodiments, the fluorescent layer includes: rheolytical additives and fluorescent powders; the fluorescent powders are yellow fluorescent powders; or the fluorescent powders are a mixture of red and green fluorescent powders.

In some embodiments, the backlight module further includes: a reflective coating film disposed on a surface of the circuit board close to the light emitting device, wherein the fluorescent layer is disposed on a surface of the reflective coating film facing away from the circuit board; a protective layer covering surfaces of the reflective coating film and the fluorescent layer facing away from the circuit board.

In some embodiments, the backlight module further includes: a diffuser between the quantum dot film layer and the light emitting device; a ratio of a distance from the light emitting device to the diffuser to spacing between two adjacent light emitting devices is less than 1/3.

DETAILED DESCRIPTION

In order to make the above-mentioned objects, features and advantages of the present disclosure more apparent, the present disclosure will be further illustrated below in combination with the drawings and embodiments. However, the exemplary embodiments can be implemented in various forms and should not be understood as being limited to the embodiments illustrated here; and on the contrary, these embodiments are provided to make the present disclosure more comprehensive and complete, and the concept of the exemplary embodiments is fully conveyed to those skilled in the art. The same reference numerals represent the same or similar structures in the figures, so the repeated description thereof will be omitted. The words expressing the positions and directions described in the present disclosure are all intended to illustrate by taking the drawings as examples, but can also be changed as needed, where the changes made are all contained in the protection scope of the present disclosure. The drawings of the present disclosure are merely intended to illustrate the relative position relationship, but not indicate the real proportion.

Figure 1:
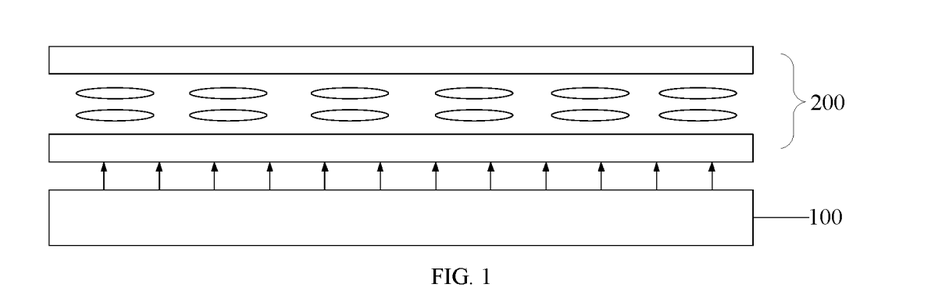
FIG. 1 illustrates a cross-sectional view of a display apparatus according to embodiments of the present disclosure.

FIG. 1 is a structural schematic diagram of a display apparatus according to embodiments of the present disclosure. As shown in FIG. 1, the display apparatus according to embodiments of the present disclosure includes:

a backlight module 100 configured to provide backlight; where the backlight module 100 may emit light uniformly from the whole light emitting surface and is configured to provide the uniformly-distributed light with sufficient brightness to the panel, so that the panel can display images normally; and a panel 200 disposed on the light emitting side of the backlight module 100 and configured for image display. The panel 200 has a plurality of pixel units in arrays, where the transmittance and color of the light incident to each pixel unit from the backlight module 100 can be controlled individually, so that the light transmitted via all the pixel units forms the displayed image.

The above display apparatus according to embodiments of the present disclosure may be a LCD screen, a LCD monitor, a LCD television or other display apparatuses, or may be a mobile phone, a tablet computer, an intelligent frame or other mobile terminals. The backlight module provides the backlight for the display apparatus, and the light emitted from the backlight module is modulated by the panel to realize the image display. The backlight module according to embodiments of the present disclosure may be controlled in partitions, and local dimming is performed for each partition, thereby achieving more precise dynamic control and improving the dynamic contrast of the liquid crystal display.

Figure 2:
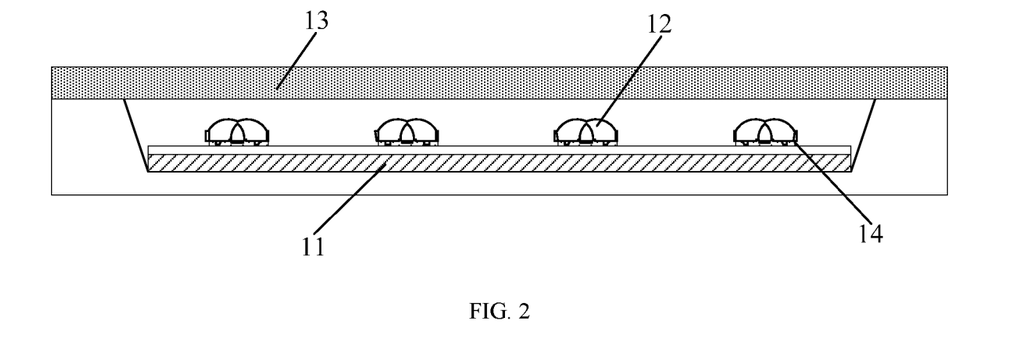
FIG. 2 illustrates a first cross-sectional view of a backlight module according to embodiments of the present disclosure.

FIG. 2 is a first cross sectional view of a backlight module according to embodiments of the present disclosure. As shown in FIG. 2, the backlight module according to embodiments of the present disclosure includes: a circuit board 11, a light emitting device 12, and a quantum dot film layer 13.

The circuit board 11 has a bearing and support functions and is configured to provide power.

In embodiments of the present disclosure, the circuit board 11 is configured to provide a drive signal to the light emitting device 12. The light emitting device 12 may be electrically connected to the circuit board 11 by soldering. The circuit board 11 may be a Printed Circuit Board (PCB for short). The backlight module may include a plurality of light bars, and each light bar includes a strip-shaped PCB, and the light emitting device 12 is soldered on the PCB. In some embodiments, the backlight module includes a plurality of light bars, and the respective light bars are arranged in parallel in a predefined direction. By controlling the spacing between the light bars as well as the spacing between the light emitting devices 12 on each light bar, the backlight modules may be designed to adapt different scenarios. By controlling the number of light emitting devices 12, the cost of the backlight module may also controlled.

Figure 3:
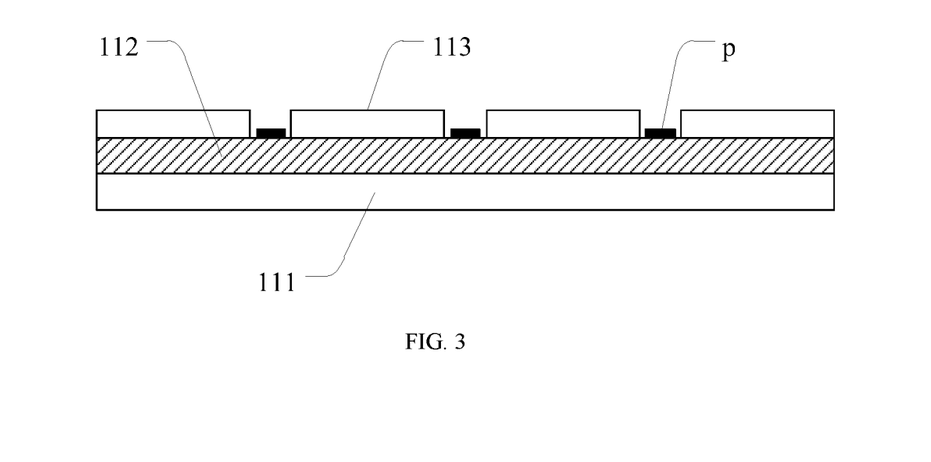
FIG. 3 illustrates a first cross-sectional view of a circuit board according to embodiments of the present disclosure.

FIG. 3 is a first cross sectional view of a circuit board according to embodiments of the present disclosure. As shown in FIG. 3, the circuit board 11 may include: a substrate 111, a line layer 112 and an insulation layer 113.

The substrate 111 may be an aluminum substrate for supporting the light bars. The line layer 112 may use the metal copper, and can be formed through an etching process and configured to drive the light emitting device 12 to emit the light. The insulation layer 113 is configured to expose the pad p for soldering the light emitting device 12 in the line layer and cover the rest part for protecting the line layer 112.

In some embodiments, when the insulation layer 113 uses a material with reflective property to be coated on the surface of the circuit board 11, this protection layer also has reflective effect, which can reflect back the light incident to one side of the circuit board 11, thereby improving the light utilization efficiency. In embodiments of the present disclosure, the insulation layer 113 may be made of white oil or other materials, which can not only protect and insulate the circuit board 11, but also act as a reflective coating to reflect the light emitted from the light emitting device 12 to one side of the circuit board 11, thereby improving the utilization efficiency of the light source.

The light emitting device 12 is arranged on the circuit board as a backlight source.

The light emitting device 12 may be soldered to the exposed pad of the circuit board 11, and the light emitting device 12 may be controlled to emit light by controlling the drive signal of the circuit board 11 after the soldering. The light emitting device 12 according to embodiments of the present disclosure in cooperation with the quantum dot film layer 13 can provide backlight with high color gamut. The quantum dot materials can absorb the high-energy light and be excited to emit the low-energy light. In some embodiments, the light emitting device 12 may be a light emitting device that emits blue light rays, and the red and green light rays are excited by exciting the quantum dot materials. The excited red and green light rays are mixed with the transmitted blue light rays to form the white light to provide the white backlight to the display apparatus.

The quantum dot film layer 13 is disposed on the side of the light emitting device 12 facing away the circuit board 11.

The quantum dot film layer 13 is disposed on the light emitting side of the light emitting device 12, absorbs the light emitted from the light emitting device 12, and may be excited to emit the light rays with a long wavelength. In some embodiments, the light emitting device 12 may emit blue light rays, and the quantum dot film layer 13 may include the red quantum dot materials and green quantum dot materials. The red quantum dot materials may be excited to emit red light rays after absorbing the blue light rays emitted from the light emitting device 12, and the green quantum dot materials may be excited to emit the green light rays after absorbing the blue light rays emitted from the light emitting device 12. Thus, the red light, green light, and unexcited blue light may be mixed into the white light as the backlight of the panel.

Figure 4:
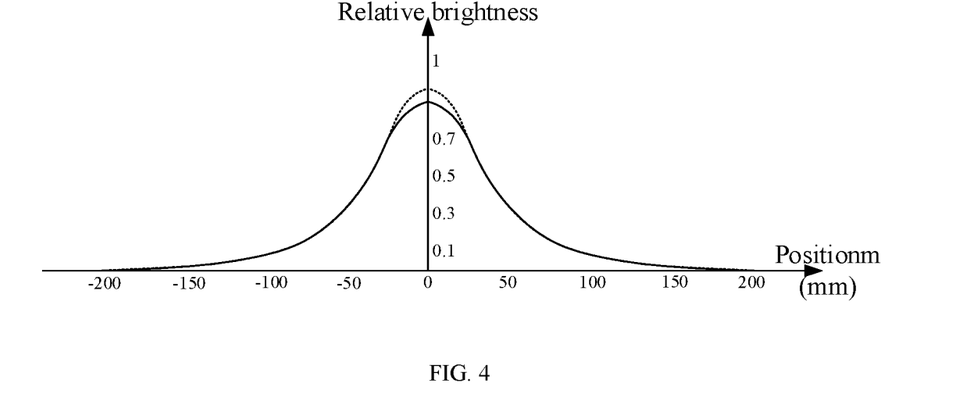
FIG. 4 illustrates a distribution curve of the relative light intensity of a light emitting device according to embodiments of the present disclosure.

In some embodiments, the closer the light intensity distribution of the light emitting device is to the Gaussian distribution curve, the more satisfied the subjective visual effect is. FIG. 4 is a distribution curve of the relative light intensity of the light emitting device according to embodiments of the present disclosure, wherein the abscissa represents the relative position to the center of the light emitting device, and the ordinate represents the relative light intensity. As shown in FIG. 4, the dotted line represents the target values of the optimal Gaussian curve distribution. When the blue light emitting device works in cooperation with the quantum dot film layer, the actual light intensity distribution of the light emitting device is indicated by the solid line in FIG. 4. As can be seen from FIG. 4, there is a certain difference between the peak values of two curves, because the blue light intensity of the quantum dot film layer directly above the light emitting device is relatively large and has exceeded the saturation peak value of the blue light required by the quantum dot film layer for excitation, where a portion of the blue light cannot be fully excited, and the unexcited blue light passes through the film, which causes the problem of bluing above the light emitting device.

The number of light emitting devices 12 used in the backlight module is limited. In some embodiments, an optical plate such as a diffuser may be used to homogenize the light emitted from the light emitting devices 12 so that the final light emitted from the backlight module is uniform. The quantum dot film layer 13 may be disposed on the light emitting side of the diffuser. The distance between the diffuser and the light emitting device 12 is referred to as light mixing distance. The larger the light mixing distance is, the better the dispersion effect of light from adjacent light emitting devices 12 is.

Figure 5:
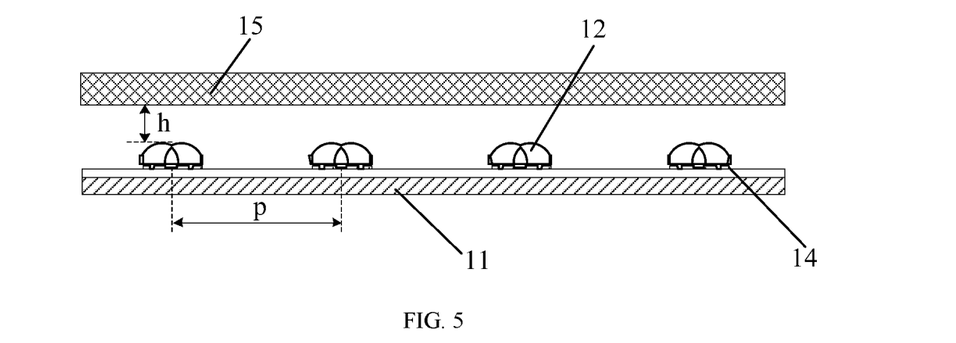
FIG. 5 is a schematic diagram for illustrating the position relationship of various components of the backlight module according to embodiments of the present disclosure.

FIG. 5 is a schematic diagram of the position relationship of individual components of the backlight module according to embodiments of the present disclosure. As shown in FIG. 5, a diffuser 15 is arranged on the light emitting side of the light emitting device 12, and there is a predefined distance between the light emitting device 12 and the diffuser 15, where the distance is the above-mentioned light mixing distance h, the distance between two adjacent light emitting devices 12 is p, and the intensity of the light with a large angle emitted from the light emitting device is less than that of the light emitted from the central area. Thus, in some embodiments, the light rays emitted from two adjacent light emitting devices 12 will overlap in part, so as to enhance the light intensity between the two light emitting devices 12. According to the design requirements of the backlight module, the distance p between the light emitting devices 12 and the distance h between the light emitting device and the diffuser 15 may be adjusted.

In some embodiments, it is found that when the ratio of the distance h between the light emitting device 12 and the diffuser 15 to the distance p between two light emitting devices 12 is less than 1/3, and the overlapping area of the light spots of the two light emitting devices 12 is less than 50%, the bluing phenomenon directly above the light emitting devices will become worse. This is because when h/p<1/3 and the overlapping area of the light spots of two adjacent light emitting devices is less than 50%, the light emitted from the light emitting devices cannot be fully mixed when reaching the quantum dot film layer, the light intensity directly above the light emitting device 12 is greater than the light intensity between two light emitting devices 12, and the light emitted directly above the light emitting device 12 has a smaller optical path in the quantum dot film layer 13 as compared to the light emitted away from directly above. Thus, this portion of the emitted light cannot fully excite the quantum dot materials to generate the exciting light, while the unexcited blue light emits directly from the quantum dot film layer 13, so that the emitted light of the area directly above the light emitting device 12 is bluish on the whole, affecting the backlight effect.

In view of the above issue, in embodiments of the present disclosure, as shown in FIG. 2, the fluorescent layer 14 is arranged in the orthographic projection area of the light emitting device 12 on the circuit board 11.

In embodiments of the present disclosure, by tracking the blue light directly above the light emitting device 12, it is found that this portion of light comes from the reflected light in the orthographic projection area of the light emitting device 12 on the circuit board 11. In order to reduce the intensity of this portion of reflected light before being incident to the quantum dot film layer 13, in embodiments of the present disclosure, the fluorescent layer 14 is arranged in the orthographic projection area of the light emitting device 12 on the circuit board. The fluorescent layer can absorb the incident light and excite the white light. Therefore, when the light emitted from the light emitting device 12 is incident to the above orthographic projection area, the fluorescent layer 14 can firstly use a portion of the light to excite the white light, and then the intensity of the light reflected to the quantum dot film layer 13 may be relatively weakened, which may just meet the requirement of the quantum dot materials for the saturation of the excitation light, so that the excitation light of the quantum dot materials and the unexcited blue light may be mixed into the white light, which provides the white backlight to the panel together with the white light excited by the fluorescent layer 14, so as to solve the bluish problem directly above the light emitting device 12.

Figure 6:
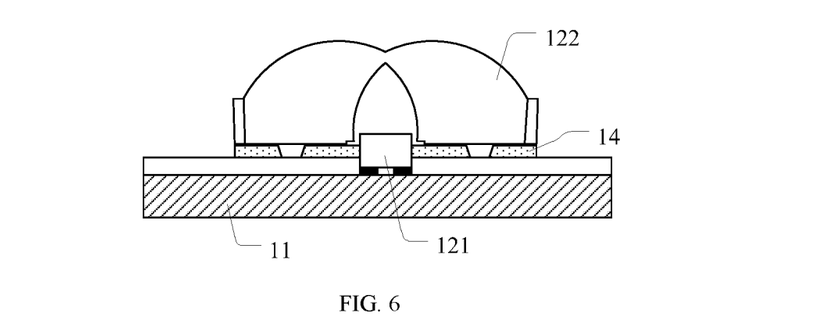
FIG. 6 illustrates a cross-sectional view of the light emitting device according to embodiments of the present disclosure.

FIG. 6 is a cross sectional view of the light emitting device according to embodiments of the present disclosure. As shown in FIG. 6, the light emitting device include: a light emitting diode 121 and a lens 122.

The light emitting diode 121 is arranged on the circuit board 11.

The light emitting diode 121 may be soldered to the exposed pad on the circuit board 11. In embodiments of the present disclosure, the light emitted from the light emitting diode 121 is blue light, where the blue light may be incident to the fluorescent layer 14 to excite the white light, and the blue light is incident to the quantum dot film layer 13 to excite the red light and green light.

The lens 122 is disposed on the light emitting side of the light emitting diode 121.

Since the light emitted from the light emitting diode 121 is concentrated in a smaller emission angle, in order to make the emitted light more uniform and to increase the emission angle, the lens 122 may be provided on the light emitting side of the light emitting diode 121. In embodiments of the present disclosure, the lens 122 may be a refractive lens, where the side of the refractive lens facing the light emitting diode 121 has a chamber, and the light emitting diode 121 is located in the chamber. The refractive lens may be of the centrally symmetric shape, and may homogenize the light emitted from the light emitting diode 121 in various directions.

In embodiments of the present disclosure, it is found that the light causing the bluish issue directly above the light emitting device 12 comes from the reflected light under the lens 122. Therefore, in the embodiments of the present disclosure, the fluorescent layer 14 may be arranged in the orthographic projection area of the lens 122 on the circuit board 11.

In some embodiments, the fluorescent layer 14 may be arranged in different patterns according to the distribution rule of the reflected light.

Figure 7:
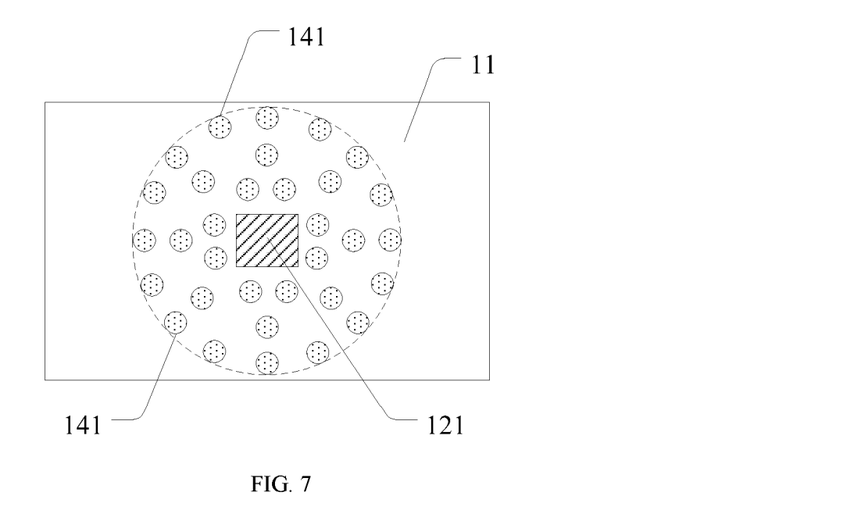
FIG. 7 is a first schematic diagram illustrating the layout of a fluorescent layer according to embodiments of the present disclosure.
Figure 8:
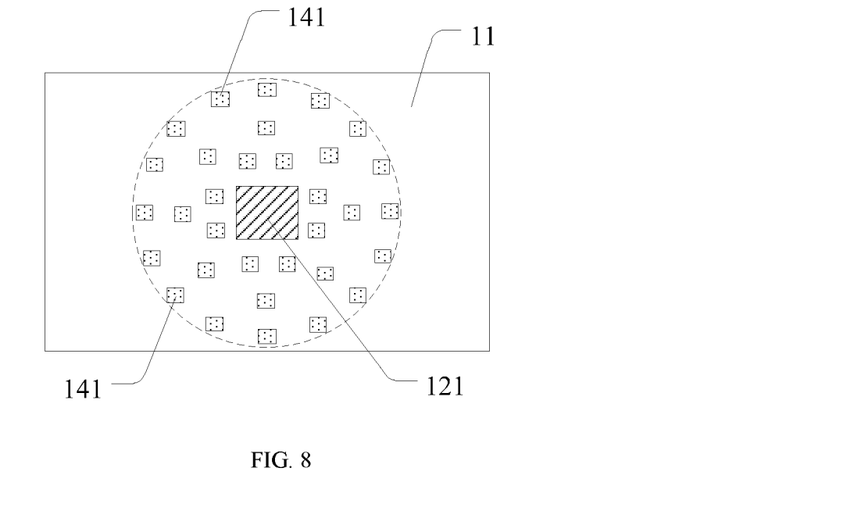
FIG. 8 is a second schematic diagram illustrating the layout of a fluorescent layer according to embodiments of the present disclosure.

FIG. 7 is a first schematic diagram illustrating the layout of a fluorescent layer according to embodiments of the present disclosure, and FIG. 8 is a second schematic diagram illustrating the layout of a fluorescent layer according to embodiments of the present disclosure. As shown in FIGS. 7 and 8, the fluorescent layer may include a plurality of spot-shaped fluorescent portions 141 that are distributed in at least one ring around the light emitting diode 121; and the shape of the ring is the same as the shape of the outer contour of the orthographic projection of the lens on the circuit board.

The light emitting diode 121 emits the light in all directions, the distribution of the emitted light incident to the circuit board 11 after the action of the lens 122 are centrally symmetric, and the light distribution is affected by the shape of the lens 122. Thus, in embodiments of the present disclosure, the spot-shaped fluorescent portions 141 are distributed according to the shape of the orthographic projection of the lens on the circuit board 11.

As shown in FIGS. 7 and 8, the outer contour of the orthographic projection of the lens on the circuit board 11 is indicated by the dotted line shown in the figures, and the spot-shaped fluorescent portions 141 may be distributed within the dotted line range on the circuit board 11. In some embodiments, the spot-shaped fluorescent portions 141 may be distributed around the light emitting diode 121, and in a ring, and the shape of the ring is the same as the contour shape shown by the dotted line in the figures.

In embodiments of the present disclosure, the distribution pattern of the fluorescent portions is configured according to the contour shape of the lens, considering that the intensity distribution of the light may be represented by the energy ring that is roughly the same as the contour of the lens, and the light intensities on the energy ring with equal distance from the light emitting diode are substantially the same when the light is incident to the reflective coating passing through the lens. Then, the fluorescent portions 141 can be distributed in one or more rings with different inner diameters in the orthographic projection area according to the outer contour of the lens, and the fluorescent portions distributed in ring may be arranged in the area with more light intensity distribution on the circuit board. The use of the spot-shaped fluorescent portions 141 may contribute to flexibly control of the pattern and position, and the fluorescent portions may be changed in size or spacing therebetween to adjust the distribution density.

In some embodiments, as shown in FIG. 7, the fluorescent portion 141 may be configured to be circular; or as shown in FIG. 8, the fluorescent portion 141 may also be configured to be square. The spot-shaped fluorescent portions 141 may be formed on the circuit board 11 by silk-screen printing. The silk-screen printed fluorescent portions may be circular or square, the sizes of the fluorescent portions at respective positions may be same or different, and the spacing between the fluorescent portions may be designed appropriately according to the light intensity distribution.

Figure 9:
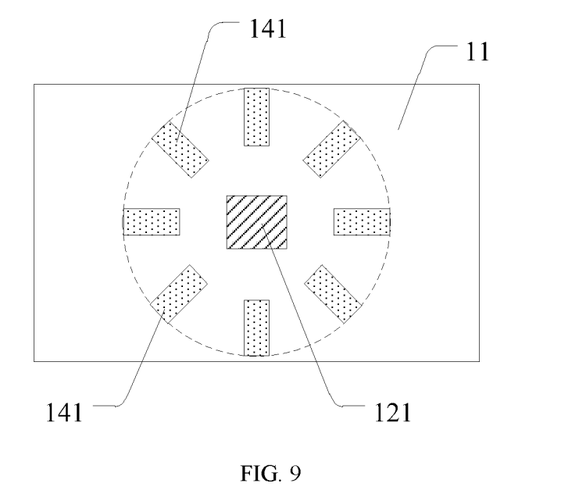
FIG. 9 is a third schematic diagram illustrating the layout of a fluorescent layer according to embodiments of the present disclosure.

FIG. 9 is a third schematic diagram illustrating the layout of a fluorescent layer according to embodiments of the present disclosure. As shown in FIG. 9, the fluorescent layer may include a plurality of strip-shaped fluorescent portions 141 that are distributed around the light emitting diode 121; and the extending direction of each strip-shaped fluorescent portion 141 is directed from the light emitting diode 121 to the outer edge of the lens.

The light emitting diode 121 emits the light in all directions, and the distribution of the emitted light incident on the circuit board 11 passing through the lens 122 is centrally symmetric, so the fluorescent portions 141 may be set as the strip shape, and the strip-shaped fluorescent portions 141 distribute as radiating from the light emitting diode 121.

The strip-shaped fluorescent portion 141 can cover a relatively large area in the extending direction of the strip-shaped fluorescent portion, and the design requirement for the fluorescent portion is reduced. The strip-shaped fluorescent portions 141 are distributed around the light emitting diode 121 and can absorb the light incident on the circuit board 11 uniformly, to thereby convert a portion of the light emitted from the light emitting diode into the white light and then emit it to one side of the quantum dot film layer, so that the intensity of the reflected blue light directly above the light emitting device is weakened, thereby fully exciting the quantum dot materials and avoiding the problem of bluing directly above the light emitting device.

Figure 10:
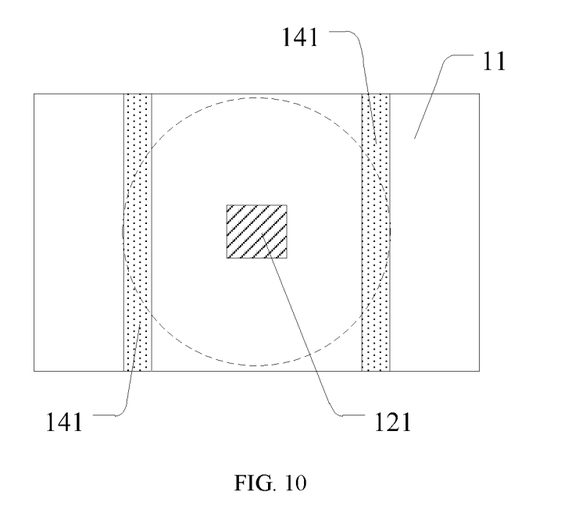
FIG. 10 is a fourth schematic diagram illustrating the layout of a fluorescent layer according to embodiments of the present disclosure.

FIG. 10 is a fourth schematic diagram illustrating the layout of a fluorescent layer according to embodiments of the present disclosure. As shown in FIG. 10, the fluorescent layer may include two strip-shaped fluorescent portions 141 parallel to each other; the strip-shaped fluorescent portions 141 are located at both sides of the light emitting diode 121 and at the positions corresponding to the edges of the lens, and both ends of the strip-shaped fluorescent portion 141 extends to the edges of the circuit board 11.

As described above, the backlight module may use a plurality of light bars, where each light bar is provided with a plurality of light emitting devices 12, and for each light emitting device, two parallel strip-shaped fluorescent portions 141 may be arranged at the edges of the lens. As shown in FIG. 10, the strip-shaped fluorescent portion 141 may be perpendicular to or at an angle with the extending direction of the light bar, and the strip-shaped fluorescent portion 141 may extend to the edge of the circuit board 11. The fabrication of the strip-shaped fluorescent portion 141 shown in FIG. 10 is relatively simple. It is only necessary to arrange the strip-shaped fluorescent portion 141 at the position corresponding to the edge of the lens, or to arrange it at the position with more light intensity distribution. In some embodiments, they may be formed at both sides of the light emitting diode 121 by silk-screen printing.

Figure 11:
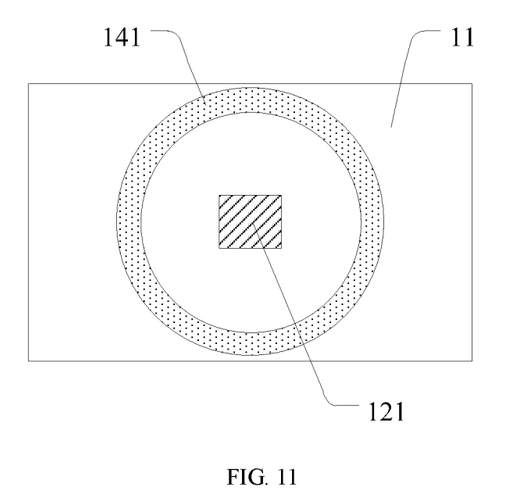
FIG. 11 is a fifth schematic diagram illustrating the layout of a fluorescent layer according to embodiments of the present disclosure.

FIG. 11 is a fifth schematic diagram illustrating the layout of a fluorescent layer according to embodiments of the present disclosure. As shown in FIG. 11, the fluorescent layer may include a ring-shaped fluorescent portion 141; the ring-shaped fluorescent portion 141 is distributed around the light emitting diode 121; and the shape of the ring-shaped fluorescent portion 141 is the same as the shape of the outer contour of the orthographic projection of the lens on the circuit board 11.

As described above, the distribution shape of the light emitted from the light emitting diode and incident on the circuit board 11 passing through the lens is similar to the shape of the contour of the lens, so the fluorescent portion 141 may be set as the ring shape, and the shape of the fluorescent portion is the same as the outer contour of the orthographic projection of the lens on the circuit board. In some embodiments, the ring-shaped fluorescent portion may be designed according to the contour of the lens, and the number of ring-shaped fluorescent portions may be one or more. When only one ring-shaped fluorescent portion 141 is used, the fluorescent portion may be arranged in the area with the largest light intensity distribution on the reflective coating. For example, as shown in FIG. 11, the ring-shaped fluorescent portion 141 may be arranged just in the area where the outer contour of the orthographic projection of the lens on the circuit board is located. When a plurality of ring-shaped fluorescent portions 141 are used, the inner diameters of respective ring-shaped fluorescent portions 141 may be different, and the fluorescent portions may be arranged in the region with the more light intensity distribution.

Figure 12:
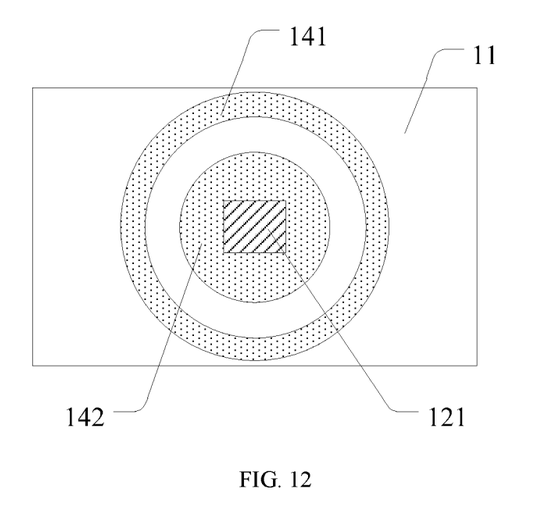
FIG. 12 is a sixth schematic diagram illustrating the layout of a fluorescent layer according to embodiments of the present disclosure.

FIG. 12 is a sixth schematic diagram illustrating the layout of a fluorescent layer according to embodiments of the present disclosure. As shown in FIG. 12, it is considered that more light in the area near the light emitting diode 121 is incident to the circuit board 11, so the fluorescent materials may be coated in the vicinity taking the light emitting diode 121 as a center to form the fluorescent portion 142, and then a ring-shaped fluorescent portion 141 is arranged at the edge area of the orthographic projection of the lens on the circuit board. In some embodiments, the fluorescent layer may be coated on the entire surface within the area with a radius of 5 mm and taking the light emitting diode 121 as a center. The comprehensive control of the reflection intensity of the incident light can be realized by combining the ring-shaped fluorescent portion 141 at the edge area and the fluorescent portion 142.

In some embodiments, considering the limitations on the materials used in the fluorescent layer and the printing process, the minimum width of the fluorescent portion 141 may be set to be greater than or equal to 0.3 mm; and the spacing between two adjacent fluorescent portions 141 is set to be greater than or equal to 0.5 mm. If the size of the fluorescent portion is too small, it may easily fall off the surface of the reflective coating film, and due to the limitation of the printing process, if the spacing between the fluorescent portions 141 is set to be too small, it will cause the adjacent fluorescent portions 141 to adhere to each other, and the desired effect cannot be achieved. Therefore, in embodiments of the present disclosure, the minimum size of the fluorescent portion 141 is at least 0.3 mm, and the spacing between the fluorescent portions 141 is at least 0.5 mm.

In embodiments of the present disclosure, the materials used in the fluorescent layer include: rheological additives and fluorescent powders.

The rheological additives are used to protect the dispersed fluorescent powder particles and control the viscosity of the fluorescent layer materials. And the fluorescent powders in the fluorescent layer have the ability to be excited to emit the white light. In some embodiments, the fluorescent powders may be yellow fluorescent powders, e.g., silicate materials. The mixture of red and green fluorescent powders may also be used. After absorbing the light emitted from the blue light emitting diode chip, the fluorescent powders may be excited to emit the white light, which may be directly emitted from the quantum dot film layer 13 to the panel as a part of the backlight.

In embodiments of the present disclosure, the parameters of the materials of the fluorescent layer are also tested and optimized, and the reference parameters of the fluorescent layer materials may refer to the following table:

| Parameter | Condition | Specific Requirement |
| --- | --- | --- |
| Additive Viscosity | 5 rpm, 25° C. | 500 Ps |
| Thixotropic Index Ti | 5, 50 rpm, 25° C. | 2.0 |
| Hardness | \ | 4H |
| Heat Resistance | 260° C. × 10 s | Not peeled off |
| Hardening Condition | \ | 150° C. × 60 min |

The viscosity of the additives of the fluorescent layer materials needs to meet the requirement like reaching 500 mpa·s (mPa/second) when starting the rotation viscometer at 5 r/min at room temperature; and the thixotropic index Ti needs to meet the requirement: readings are η5 and η50 respectively when starting the rotation viscometer at 5 r/min and 50 r/min at room temperature, wherein η5 is the apparent viscosity at 5 r/min and η50 is the apparent viscosity at 50 r/min. The calculation formula of Ti is Ti=η5/η50, and the thixotropy index Ti needs to reach 2.0. The hardness of the fluorescent layer needs to reach 4H or more; the heat resistance temperature needs to ensure that the fluorescent layer cannot be peeled off within 10 s at 260° C.; and the specific requirement of printing and hardening of the fluorescent layer is to harden within 60 min at 150° C.

The embodiments of the present disclosure have verified by experiments that, when the materials of the fluorescent layer meet the above conditions, it meets the use requirement. When the materials used and the scenario change, the above parameters may also change accordingly. The specific values of the above parameters are not limited in the embodiments of the present disclosure.

Figure 13:
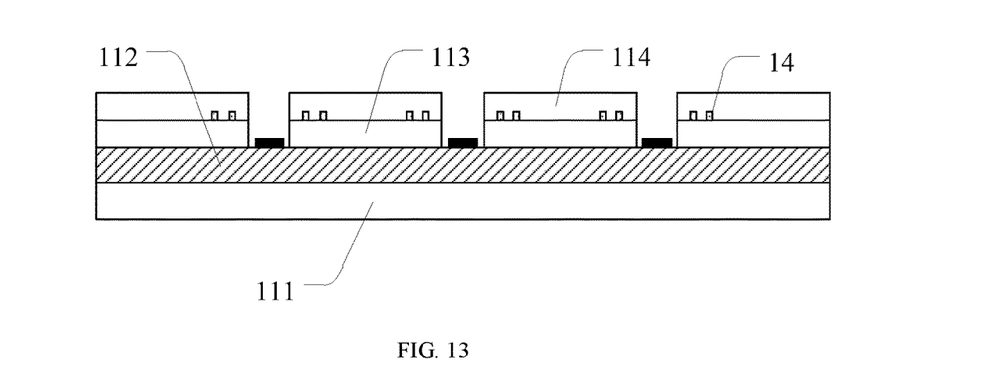
FIG. 13 illustrates a first cross-sectional view of a circuit board according to embodiments of the present disclosure.

FIG. 13 is a first cross sectional view of a circuit board according to embodiments of the present disclosure. As shown in FIG. 13, the circuit board according to embodiments of the present disclosure further includes:

a reflective coating film disposed on the surface of the circuit board 11 close to the light emitting device 12, where the fluorescent layer 14 is disposed on the surface of the reflective coating film facing away from the circuit board 11.

As mentioned above, the reflective coating film may be an insulation protective layer 113 on the surface of the circuit board. The surface of the circuit board is coated with the materials with reflective property, so that the light emitted from the light emitting device 12 to one side of the circuit board may be re-emitted by the reflective coating film to one side of the panel, thereby improving the utilization efficiency of the light source. The reflective coating film (113) can use the white oil and other materials, and the reflectivity can reach 97%.

A protective layer 114 is provided to cover the surfaces of the reflective coating (113) and the fluorescent layer 14 facing away from the circuit board 11.

Since the fluorescent layer is silk-screen printed in the area under the lens, when the light emitting diode is lighten, the temperature is relatively high, and the materials of the fluorescent layer 14 exposed to the air will gradually be oxidized and fail. This protective layer 114 added above can isolate the air, to ensure the reliability and optical stability of the fluorescent layer 14. In some embodiments, the protective layer 114 may be an organic protective film, which is made of the transparent material, and does not affect the light incidence and emission, and protects the fluorescent layer from being damaged.

Figure 14:
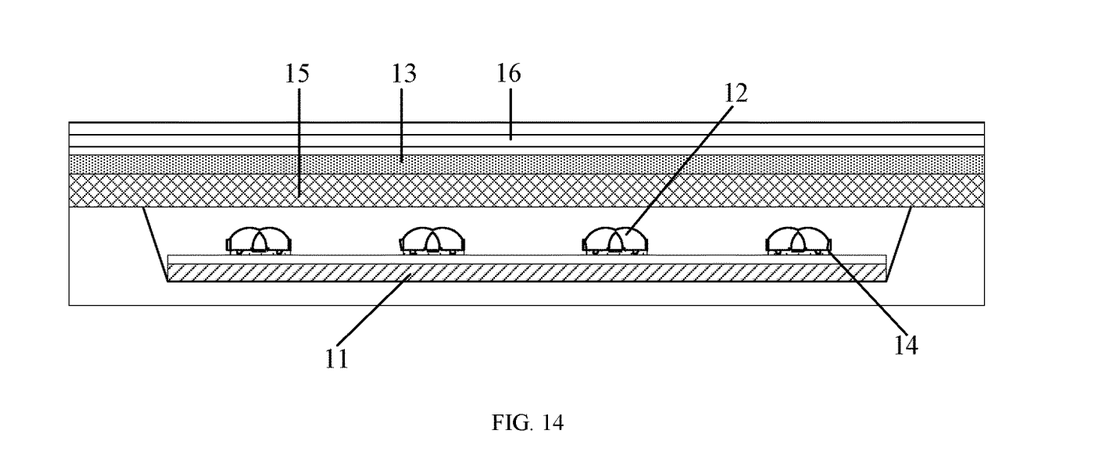
FIG. 14 illustrates a second cross-sectional view of a backlight module according to embodiments of the present disclosure.

FIG. 14 is a second cross sectional view of a backlight module according to embodiments of the present disclosure. As shown in FIG. 14, the backlight module further includes: a diffuser 15 and an optical sheet 16.

The diffuser 15 is located between the quantum dot film layer 13 and the light emitting device 12.

The diffuser 15 is usually provided with scattering particle materials therein. After the light is incident to the diffuser, the scattering materials continuously refracts and reflects the light, so as to achieve the effect of dispersing the light and then making the light uniform. The material used for the diffuser is generally selected from at least one of polymethyl methacrylate (PMMA), polycarbonate (PC), polystyrene-based material (PS) and polypropylene (PP), which is not limited here.

In embodiments of the present disclosure, the ratio of the distance from the light emitting device 12 to the diffuser 15 to the spacing between two adjacent light emitting devices 12 may be less than 1/3, that is, in the embodiments of the present disclosure, the fluorescent layer 14 arranged in the orthographic projection area of the light emitting device 12 on the circuit board can effectively avoid the bluish phenomenon directly above the light emitting device 12, so it can be applied to the scenario where the spacing between the light emitting devices 12 is relatively large.

The optical sheet 16 is disposed on the side of the quantum dot film layer 13 facing away from the diffuser 15.

The optical sheet 16 may include various types of films. For example, the optical sheet 16 may include a prism sheet, a reflective polarizer, etc. The prism sheet may change the emission angle of the light, thereby changing the viewing angle of the display apparatus. The reflective polarizer may improve the utilization of the light, and make the emitted light have the polarization property, so that the polarization sheet under the liquid crystal panel can be omitted.

The display apparatus in the embodiments of the present disclosure includes: a backlight module configured to provide the backlight; a panel disposed on the light emitting side of the backlight module and configured for image display; the backlight module includes: a circuit board having bearing and support functions and configured to provide the power; a light emitting device arranged on the circuit board; and a quantum dot film layer located on the side of the light emitting device facing away from the circuit board. In embodiments of the present disclosure, a fluorescent layer is arranged in the orthographic projection area of the light emitting device on the circuit board, where the fluorescent layer can absorb the incident light and excite the white light. Therefore, when the light emitted from the light emitting device is incident to the above orthographic projection area, the fluorescent layer can firstly use a portion of the light to excite the white light, thus the intensity of the light reflected to the quantum dot film layer may be relatively weakened, which may just meet the requirement of the quantum dot materials for the saturation of the excitation light, so that the excitation light of the quantum dot materials and the unexcited blue light may be mixed into the white light, which provides the white backlight to the panel together with the white light excited by the fluorescent layer, so as to solve the problem of bluing directly above the light emitting device.

Although the embodiments of the present disclosure have been described, those skilled in the art can make additional alterations and modifications to these embodiments once they learn about the basic creative concepts. Thus the attached claims are intended to be interpreted to include the above embodiments as well as all the alterations and modifications falling within the scope of the present disclosure.

What is claimed is:

1. A display apparatus, comprising:
   a backlight module configured to provide backlight;
   a panel disposed on a light emitting side of the backlight module and configured for image display;
   the backlight module comprises:
   a circuit board having bearing and support functions and configured to provide power;
   a light emitting device arranged on the circuit board, wherein the light emitting device comprises: a light emitting diode disposed on the circuit board, and a lens at a light emitting side of the light emitting diode; and
   a quantum dot film layer disposed on a side of the light emitting device facing away from the circuit board;
   wherein a fluorescent layer is provided in an orthographic projection area of the lens at the light emitting side of the light emitting device on the circuit board, and the fluorescent layer is configured to absorb light emitted from the light emitting device to excite white light;
   wherein the fluorescent layer comprises a ring-shaped fluorescent portion;
   the ring-shaped fluorescent portion is unbroken and around the light emitting diode; and
   a contour of the ring-shaped fluorescent portion is similar to an outer contour of the orthographic projection of the lens on the circuit board;
   wherein the fluorescent layer comprises: rheolytical additives and fluorescent powders.

2. The display apparatus according to claim 1, wherein the fluorescent layer comprises spot-shaped fluorescent portions; the spot-shaped fluorescent portions are distributed in at least one ring around the light emitting diode; and
   a contour of the at least one ring is similar to an outer contour of the orthographic projection of the lens on the circuit board.

3. The display apparatus according to claim 2, wherein the spot-shaped fluorescent portion is circular or square.

4. The display apparatus according to claim 2, wherein a minimum width of the fluorescent portion is greater than or equal to 0.3 mm;
   spacing between two adjacent fluorescent portions is greater than or equal to 0.5 mm.

5. The display apparatus according to claim 1, wherein the fluorescent layer comprises strip-shaped fluorescent portions;
   the strip-shaped fluorescent portions are distributed around the light emitting diode; and
   an extending direction of the strip-shaped fluorescent portions is directed from the light emitting diode to an outer edge of the lens.

6. The display apparatus according to claim 1, wherein the fluorescent layer comprises two strip-shaped fluorescent portions parallel to each other;
   the strip-shaped fluorescent portions are located at both sides of the light emitting diode and at areas corresponding to edges of the lens, and both ends of a strip-shaped fluorescent portion extend to edges of the circuit board.

7. The display apparatus according to claim 1, wherein the fluorescent powders are yellow fluorescent powders; or the fluorescent powders are a mixture of red and green fluorescent powders.

8. The display apparatus according to claim 1, wherein the backlight module further comprises:
   a reflective coating film disposed on a surface of the circuit board close to the light emitting device, wherein the fluorescent layer is disposed on a surface of the reflective coating facing away from the circuit board;
   a protective layer covering surfaces of the reflective coating film and the fluorescent layer facing away from the circuit board.

9. The display apparatus according to claim 1, wherein the backlight module further comprises:
   a diffuser between the quantum dot film layer and the light emitting device;
   wherein a ratio of a distance from the light emitting device to the diffuser to spacing between two adjacent light emitting devices is less than 1/3.

* * * * *